(12) United States Patent
Mii et al.

(10) Patent No.: US 7,851,347 B2
(45) Date of Patent: Dec. 14, 2010

(54) WIRE BONDING METHOD AND SEMICONDUCTOR DEVICE

(75) Inventors: Tatsunari Mii, Ube (JP); Shinsuke Tei, Musashimurayama (JP); Hayato Kiuchi, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 12/589,482

(22) Filed: Oct. 21, 2009

(65) Prior Publication Data

US 2010/0148369 A1 Jun. 17, 2010

(30) Foreign Application Priority Data

Oct. 21, 2008 (JP) .............................. 2008-270913

(51) Int. Cl.
*H01L 21/44* (2006.01)
(52) U.S. Cl. ...................... 438/617; 257/738; 257/784; 228/180.5
(58) Field of Classification Search ................. 438/617; 228/180.5; 257/738, 784
See application file for complete search history.

(56) References Cited

U.S. PATENT DOCUMENTS

| 5,989,995 | A | 11/1999 | Nishiura et al. |
| 6,112,974 | A | 9/2000 | Nishiura et al. |
| 6,380,634 | B1 | 4/2002 | Umehara |
| 2004/0104477 | A1 | 6/2004 | Fujisawa |
| 2004/0262369 | A1 | 12/2004 | Mii et al. |
| 2006/0151579 | A1 | 7/2006 | Fujisawa et al. |
| 2006/0163331 | A1* | 7/2006 | Babinetz .................. 228/180.5 |
| 2006/0213956 | A1 | 9/2006 | Yu |
| 2007/0034674 | A1 | 2/2007 | Mii et al. |

FOREIGN PATENT DOCUMENTS

| JP | H08-316260 | 11/1996 |
| JP | H09-51011 | 2/1997 |
| JP | H10-189641 | 7/1998 |
| JP | 2000-49185 | 2/2000 |
| JP | 2000-114304 | 4/2000 |
| JP | 2004-172477 | 6/2004 |
| JP | 2005-39192 | 2/2005 |
| JP | 2006-270096 | 10/2006 |
| JP | 4137061 | 8/2008 |
| JP | 2008-235787 | 10/2008 |

* cited by examiner

*Primary Examiner*—Thao X Le
*Assistant Examiner*—Geoffrey Ida
(74) *Attorney, Agent, or Firm*—William L. Androlia; H. Henry Koda

(57) ABSTRACT

Wire bonding method for reducing height of a wire loop in a semiconductor device, including a first bonding step of bonding an initial ball formed at a tip end of a wire onto a first bonding point using a capillary, thereby forming a pressure-bonded ball; a wire pushing step of pushing the wire obliquely downward toward the second bonding point at a plurality of positions by repeating a sequential movement for a plurality of times, the sequential movement including moving of the capillary substantially vertically upward and then obliquely downward toward the second bonding point by a distance shorter than a rising distance that the capillary has moved upward; and a second bonding step of moving the capillary upward and then toward the second bonding point, and bonding the wire onto the second bonding point by pressure-bonding.

8 Claims, 17 Drawing Sheets

WIRE BONDING METHOD AND SEMICONDUCTOR DEVICE

BACKGROUND OF THE INVENTION

1. Technical Field

The present invention relates to a wire-bonding method of connecting a first bonding point with a second bonding point by a wire, and to a semiconductor device having a wire-loop shape formed by connecting a first bonding point with a second bonding point by a wire.

2. Description of the Related Art

For assembling a semiconductor device, wire bonding for connecting a pad of a semiconductor chip mounted on a lead frame with a lead of the lead frame by a thin metal wire is used. A wire-bonding apparatus is used in the wire bonding, in which an initial ball is first formed at a tip end of the wire, and the initial ball is pressure-bonded onto the pad of the semiconductor chip using the capillary, thereby forming a pressure-bonded ball. In this method, after moving the capillary upward to make a reverse motion in a direction away from a second bonding point, the capillary is further moved upward to a predetermined height, and then moved toward the second bonding point, thereby the wire is connected to the second bonding point (see FIG. 4 to FIG. 6 of Japanese Unexamined Patent Application Publication No. 2004-172477 (hereinafter referred to as "Patent Document 1"), for example).

The wire is bonded by moving the capillary in this manner, and, in many cases, a loop shape of the wire is formed either in a triangular shape including a wire neck that extends upward from the pressure-bonded ball that has been pressure-bonded onto the pad of the semiconductor chip and a sloped portion that has been bent toward the second bonding point at the wire neck, or in a trapezoidal shape including a flat portion that extends substantially horizontally in a direction toward the second bonding point from the wire neck and a sloped portion that extends from the flat portion toward the second bonding point. This is because, when a portion close to the pressure-bonded ball is moved horizontally in the direction toward the second bonding point with respect to the capillary, the neck portion is often damaged due to a friction between the capillary and the thin metal wire that is produced while moving.

However, the loop height of the wire in this wire-loop shape is high because the wire neck that rises from the pressure-bonded ball is included, and this poses a problem that the height or thickness of the semiconductor device assembled by wire bonding as a whole cannot be made small.

Therefore, a method has been proposed, the method making a reverse motion such that the capillary is moved slightly upward and away from the second bonding point after bonding to a first bonding point, making a forward motion such that the capillary is further moved slightly upward and in the direction toward the second bonding point, then moving the capillary downward to press the wire neck portion against the pressure-bonded ball and fold the wire neck portion up on the pressure-bonded ball, making the wire to extend either in a horizontal direction or in a direction slightly sloped upward from the horizontal direction, moving the capillary upward while feeding the wire from a tip end of the capillary, and then moving the capillary toward the second bonding point, thereby connecting the wire to the second bonding point (see FIG. 1 to FIG. 3 of Patent Document 1, or FIG. 1 to FIG. 3 of Japanese Unexamined Patent Application Publication No. H09-51011 (hereinafter referred to as "Patent Document 2"), for example).

Also, another bonding method of bonding a first bonding point with a second bonding point has been proposed, the method forming a pressure-bonded ball at a first bonding point, moving the capillary slightly upward and then toward a second bonding point, moving the capillary downward by a distance shorter than a rising distance that the capillary has moved upward to press down the wire, and then moving the capillary upward and toward the second bonding point while feeding out the wire, thereby connecting the wire to the second bonding point (see FIG. 1 and FIG. 2 of Japanese Unexamined Patent Application Publication No. 2005-39192 (hereinafter referred to as "Patent Document 3"), for example).

Moreover, still another bonding method of forming a low-profile loop with an arch height of its wire loop of about 100 μm has been proposed, the method forming a pressure-bonded ball by bonding to a first bonding point, carrying out a first upward movement, a first downward and parallel movement, a second upward movement, and a second downward and parallel movement of the capillary, and finally bonding to the second bonding point. In this method, it is proposed that the capillary be moved up to a position that is several times higher than a desired arch height of the wire loop in the first upward movement and further moved by a length of the wire loop in the second upward movement, and the first and the second downward and parallel movements be carried out in an arc-wise manner (see FIG. 3 of Japanese Unexamined Patent Application Publication No. H08-316260 (hereinafter referred to as "Patent Document 4"), for example).

In addition, a further bonding method of bonding a first bonding point with a second bonding point has been proposed, the method bonding at a first bonding point to form a pressure-bonded ball and a ball neck, moving the capillary obliquely upward toward a second bonding point to make the ball neck sloped, carrying out a flexing step for a plurality of times of flexing the wire by the upward and parallel movement of the capillary, then moving the capillary upward and looping the capillary to the second bonding point, thereby bonding the wire to the second bonding point (see FIG. 1 to FIG. 4 of Japanese Patent No. 4137061 (hereinafter referred to as "Patent Document 5"), for example).

The conventional bonding method described in the Patent Document 1 or 2 poses a problem that the wire near the first bonding point can be damaged since the wire is folded up onto the pressure-bonded ball to form a head portion. Also, since the head portion cannot be made particularly low, it is occasionally not possible to satisfy the demand for decreasing the height of the wire loop as a whole.

In this regard, the conventional bonding method described in the Patent Document 3 does not form the head portion which is formed by folding up the wire on the pressure-bonded ball as in the case of the method described in the Patent Document 1 or 2, and the wire that is connected to the pressure-bonded is bent toward the second bonding point thereby connecting the wire to the second bonding point, and therefore it is possible to reduce the height of the wire loop as a whole as compared to the method described in the Patent Document 1 or 2. Moreover, in the conventional bonding method described in the Patent Document 5, it is possible to reduce the height of the wire loop while suppressing the damage to the wire near the first bonding point.

However, according to the conventional bonding method described in the Patent Document 3, a portion of the wire connected to the pressure-bonded ball is pressed toward the second bonding point in the horizontal direction by the capillary, and then the capillary is moved downward by the distance shorter than the rising distance of the capillary. As a result, the portion of the wire connected to the pressure-bonded ball is occasionally pulled along the axial direction of the wire due to the frictional force produced between the capillary and the wire when the capillary is moved horizontally. When the wire is pulled in this manner, the cross-sectional area of the portion of the wire connected to the pressure-bonded ball disadvantageously becomes small and the strength of the wire decreases. This could result in a problem of disconnection of the wire. Similarly, as the capillary is horizontally moved toward the second bonding point in the conventional bonding method described in the Patent Document 5, the portion of the wire connected to the pressure-bonded ball is pulled due to the frictional force produced between the capillary and the wire, and thus the wire strength adversely decreases.

In addition, according to the conventional bonding method described in the Patent Document 4, the capillary that has been moved upward is moved downward and parallelly along an arc-wise trajectory. Therefore, it is possible to prevent the decrease in the strength of the wire as in the conventional techniques described in the Patent Document 3 and Patent Document 5. However, a problem has been noted that the height of the wire loop can be only as low as about 100 μm, and it is adversely difficult to form a lower-profile loop.

BRIEF SUMMARY OF THE INVENTION

In view of the above problems, an object of the present invention is to reduce the height of a wire loop while preventing decrease in strength of the wire when connecting the first bonding point with the second bonding point by the wire.

The wire-bonding method according to the present invention is a wire-bonding method of connecting between a first bonding point and a second bonding point by a wire, and the method includes: a first bonding step of bonding an initial ball formed at a tip end of the wire onto the first bonding point by means of a capillary, thereby forming a pressure-bonded ball; a wire pushing step, after the first bonding step, of pushing the wire obliquely downward at a plurality of positions by repeating a sequential movement for a plurality of times, the sequential movement including moving of the capillary substantially vertically upward and then obliquely downward toward the second bonding point by a distance shorter than a rising distance that the capillary has moved upward; and a second bonding step, after the wire pushing step, of moving the capillary upward and then toward the second bonding point, and bonding the wire onto the second bonding point by pressure-bonding.

In the wire-bonding method according to the present invention, it is also preferable that the rising distance of the capillary in a first one of the sequential movements be greater than the rising distance of the capillary in a second one of the sequential movements. Alternatively, it is also preferable that the sequential movement be an upward arc-wise movement that is carried out after the first bonding step, and include moving of the capillary substantially vertically upward, and then toward the second bonding point arc-wisely in an arc having a radius equal to the rising distance of the capillary.

Also, in the wire-bonding method according to the present invention, it is also preferable that the arc-wise movement of the capillary in one of the sequential movements be an arcing motion centering the ending point of the arc-wise movement of the capillary in a previous one of the sequential movements. Alternatively, it is also preferable that a moving angle of the arc-wise movement of the capillary in the first sequential movement be greater than a moving angle of the arc-wise movement of the capillary in the second sequential movement.

Also, in the wire-bonding method according to the present invention, it is also preferable that, in the arc-wise movement in the upward arc-wise movement, the capillary move along an approximating polygonal line that approximates the circular arc by a plurality of lines. Alternatively, it is also preferable that the rising distance of the capillary in the third and subsequent ones of the sequential movements be greater than the rising distance of the capillary in the first and second sequential movements.

It is also preferable that the wire-bonding method according to the present invention include a kink forming step, between the wire pushing step and the second bonding step, of forming a kink in the wire by carrying out a reverse motion at least once, the reverse motion including moving of the capillary upward and then away from the second bonding point.

A semiconductor device according to the present invention is a semiconductor device having a wire-loop that connects between a first bonding point and a second bonding point by a wire, and the shape of the wire-loop of the semiconductor device is produced by a process including: a first bonding step of bonding an initial ball formed at a tip end of the wire onto the first bonding point by means of a capillary, thereby forming a pressure-bonded ball; a wire pushing step, after the first bonding step, of pushing the wire obliquely downward at a plurality of positions by repeating a sequential movement for a plurality of times, the sequential movement including moving of the capillary substantially vertically upward and then obliquely downward toward the second bonding point by a distance shorter than a rising distance that the capillary has moved upward; and a second bonding step, after the wire pushing step, of moving the capillary upward and then toward the second bonding point, and bonding the wire onto the second bonding point by pressure-bonding.

In the semiconductor device according to the present invention, it is also preferable that the rising distance of the capillary in a first one of the sequential movements be greater than the rising distance of the capillary in a second one of the sequential movements. Alternatively, it is also preferable that the sequential movement be an upward arc-wise movement that is carried out after the first bonding step, and includes moving of the capillary substantially vertically upward, and then toward the second bonding point arc-wisely in an arc having a radius equal to the rising distance of the capillary.

The present invention provides an advantageous effect of reducing the height of a wire loop while preventing decrease in strength of a wire in connecting a first bonding point with a second bonding point.

DETAILED DESCRIPTION OF THE INVENTION

Figure 1:
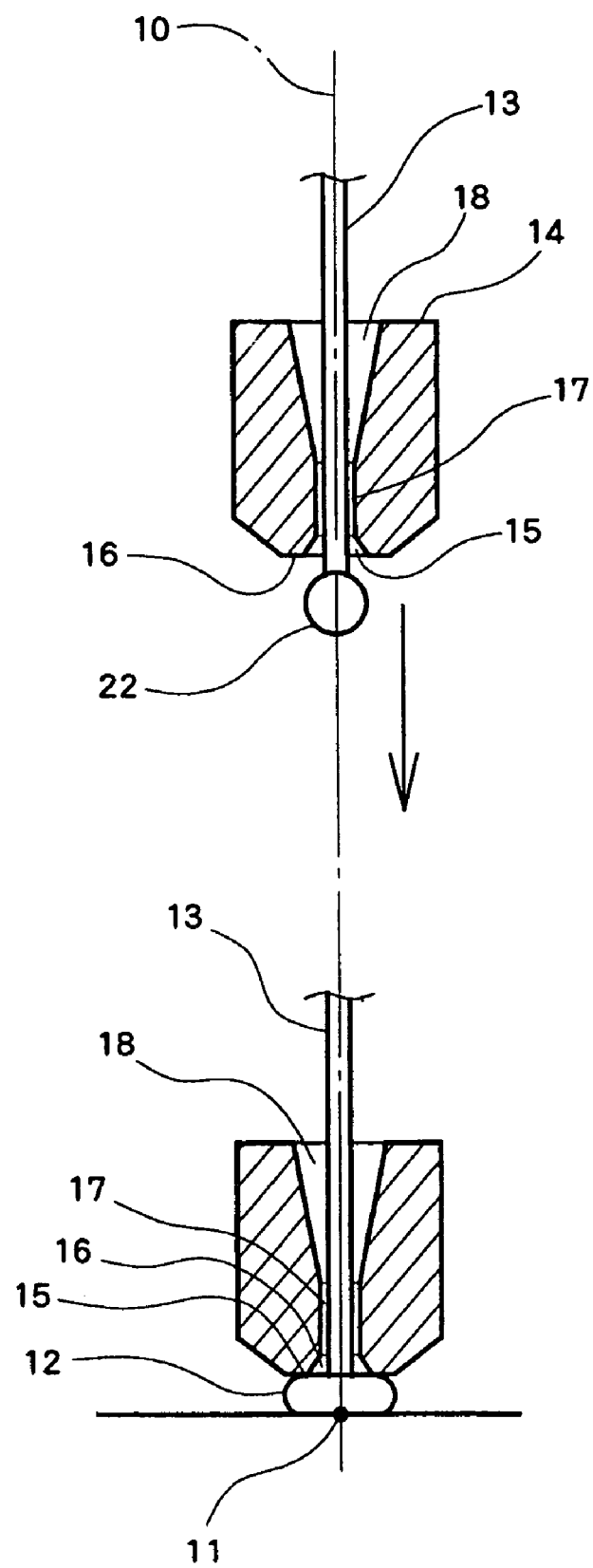
FIG. 1 is an illustrative diagram showing a first bonding step of an exemplary embodiment of a wire-bonding method according to the present invention.

The following describes exemplary embodiments of a bonding method according to the present invention and a semiconductor device having a wire loop formed by this bonding method with reference to the drawing. While a semiconductor device is provided with wire loops that connect a plurality of first bonding points respectively with a plurality of second bonding points, the connection between a single first bonding point and a single second bonding point is described below. As shown in FIG. 1, after an initial ball 22 is formed at a tip end of a wire 13 passing through a capillary 14 using, for example, a flame off probe that is not shown in the drawing, the capillary 14 is moved downward along a center line 10 of a first bonding point 11 as shown by an arrow in FIG. 1. Then, the initial ball 22 is pressed against and bonded onto the first bonding point 11 by a face portion 16 and an inner chamfer 15 at a tip end of the capillary 14, thereby a pressure-bonded ball 12 is formed on the first bonding point 11. The pressure-bonded ball 12 is pressure-bonded onto the first bonding point 11 by the pressing of the capillary (first bonding step).

Figure 2:
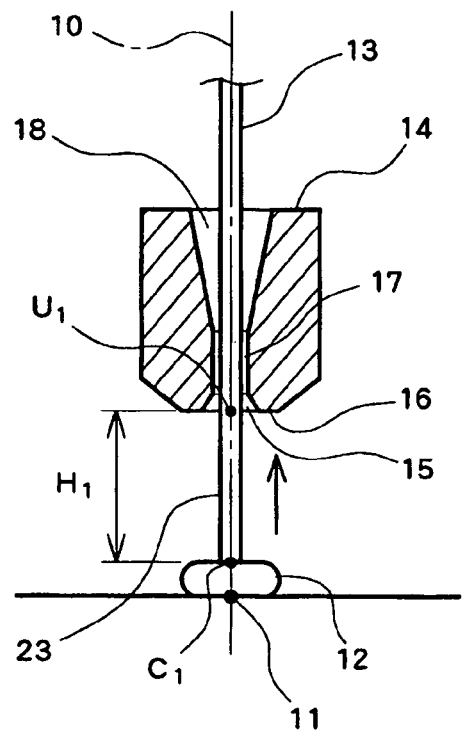
FIG. 2 is an illustrative diagram showing a first sequential movement in a pushing step of the exemplary embodiment of the wire-bonding method according to the present invention.
Figure 12:
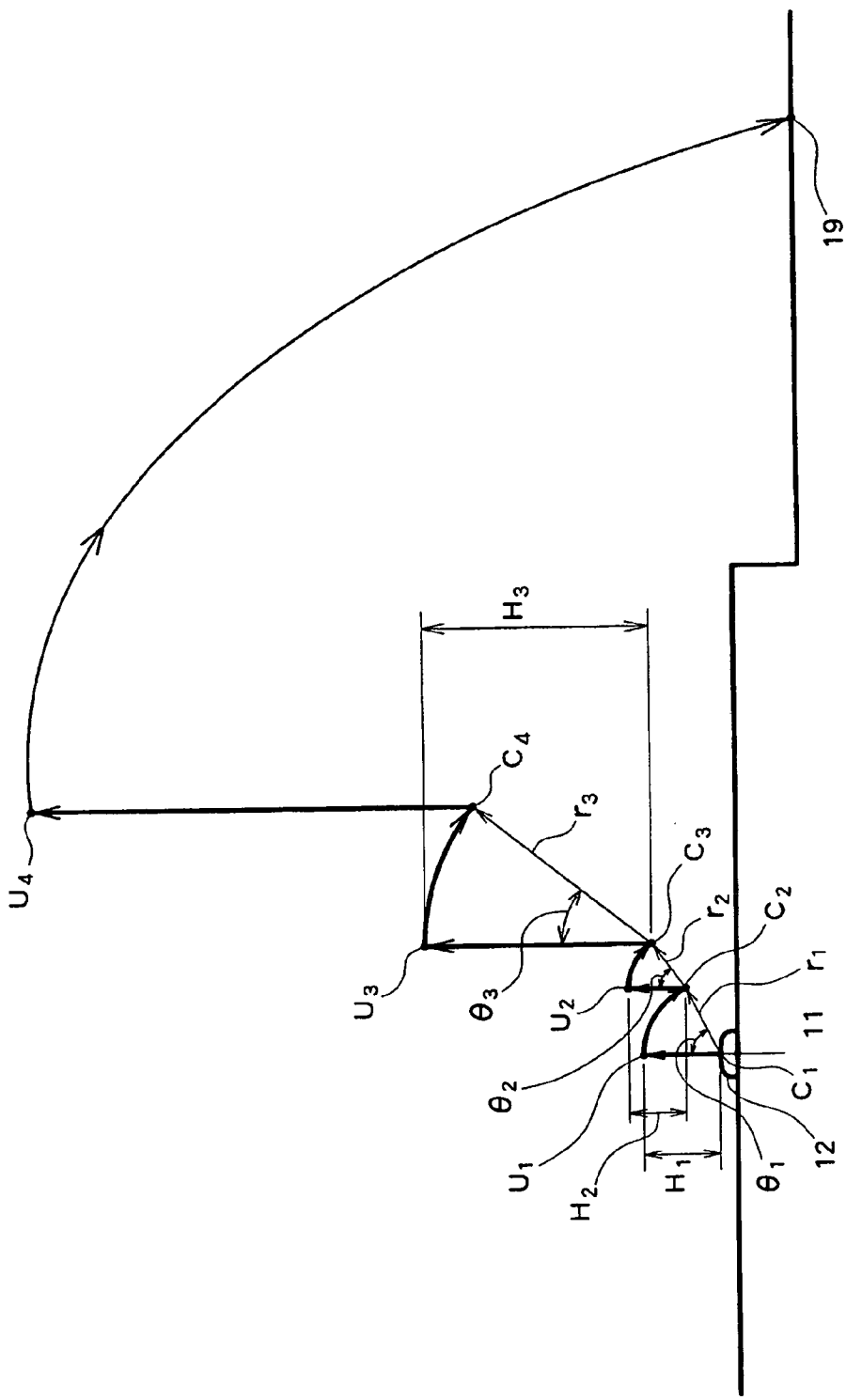
FIG. 12 is an illustrative diagram showing how a tip end of the capillary is moved in the exemplary embodiment of the wire-bonding method according to the present invention.

As shown in FIG. 2 and FIG. 12, a first sequential movement is started by moving the capillary 14 vertically upward by a height $H_1$ along the center line 10. Upon completion of the upward movement of the capillary 14, the tip end of the capillary 14 is positioned at a point $U_1$, which is at the height $H_1$ from the upper surface of the pressure-bonded ball 12.

Figure 3A:
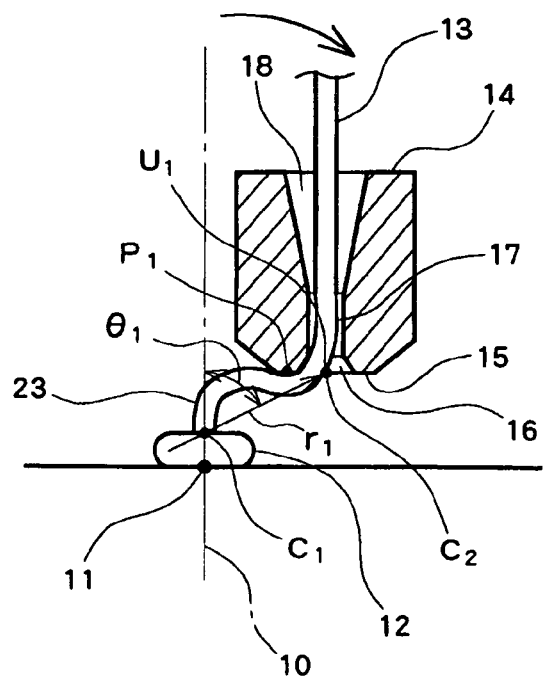
FIG. 3(a) is an illustrative diagram showing the first sequential movement in the pushing step of the exemplary embodiment of the wire-bonding method according to the present invention.

As shown in FIGS. 3(a), (b), and FIG. 12, centering a point $C_1$ at an intersection of the upper surface of the pressure-bonded ball 12 with the center line 10, the capillary 14 is moved toward a second bonding point 19 by an angle $\theta_1$ arc-wisely along an arc having the height $H_1$ as its radius $r_1$ shown in FIG. 2. The angle $\theta_1$ is smaller than 90 degrees and, for example, about 45 degrees. Upon completion of the first arcing movement of the capillary 14, the tip end of the capillary 14 is positioned at a point $C_2$, which is closer to the second bonding point 19 than the point $U_1$ is, and at a height between the point $U_1$ and the point $C_1$. In other words, the capillary 14 is moved downward in the arcing movement from the point $U_1$ by a difference in height between the point $U_1$ and the point $C_2$, and moved from the point $U_1$ toward the second bonding point 19. As the difference in height between the point $U_1$ and the point $C_2$ is smaller than the rising height $H_1$ of the capillary 14 shown in FIG. 2, the tip end of the capillary 14 is moved downward by the first arcing motion by a distance smaller than the rising distance $H_1$ of the capillary 14, and obliquely downward toward the second bonding point 19. With this movement, a neck wire 23 is moderately curved toward the second bonding point 19, and the neck wire 23 is pushed obliquely downward so as to form a first kinked portion to loop in a horizontal direction (wire pushing step).

Figure 3B:
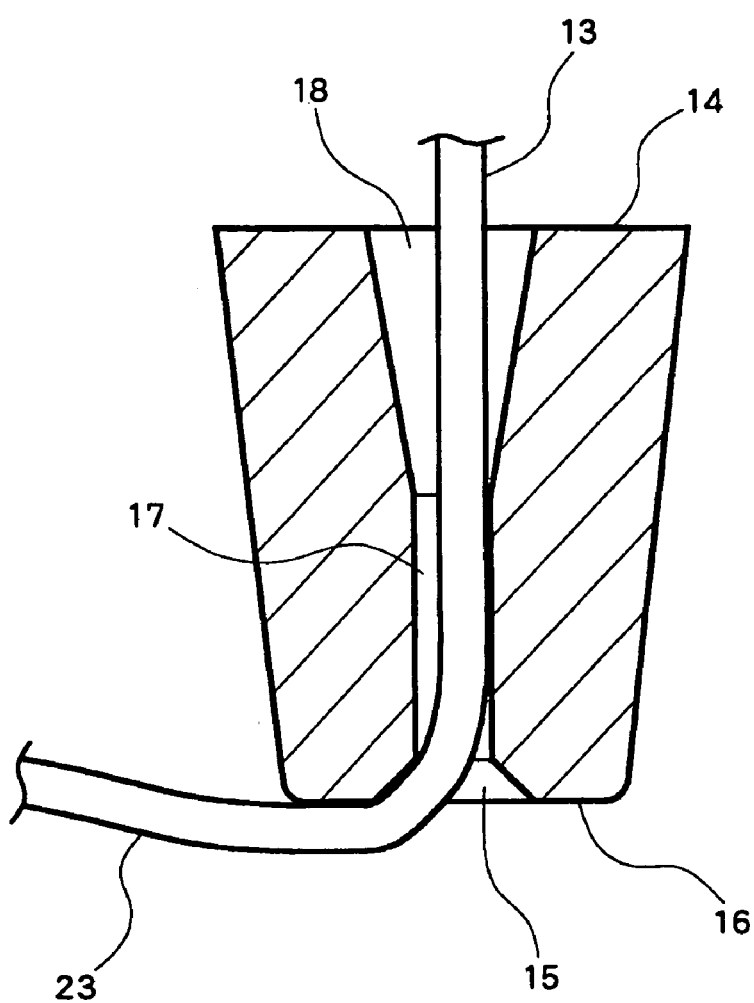
FIG. 3(b) is an enlarged view of a capillary and a wire shown in FIG. 3(a) that are being moved.

When the capillary 14 makes the first arcing motion, as shown in FIG. 3(b)A, the neck wire 23 is laterally moved by the tapered portion of the inner chamfer 15 of the capillary 14, and pushed downward by the face portion 16 of the capillary 14. In this process, as the capillary 14 moves arc-wisely in the arc centering the point $C_1$, the distance between the point $C_1$ and the tip end of the capillary 14 remains constant without making any substantial change. As a result, the neck wire 23 is not pulled by the capillary 14 in the axial direction of the neck wire 23 when the capillary 14 is moved obliquely downward from the point $U_1$ toward the point $C_2$, and it is possible to prevent a tensile load from being applied to the neck wire 23 shown in FIG. 2. Also, it is possible to prevent the neck wire 23 from becoming thin due to the tensile load, and thus preventing decrease in strength of the neck wire 23.

Moreover, as the tip end of the wire 13 is heated by an electric discharge by, for example, a flame off probe when forming the initial ball 22 at the tip end of the wire 13, the wire 13 is thermally hardened by the heat in many cases and the neck wire 23 often remains thermally hardened. The length of a portion of the wire that is thermally hardened usually differs depending on, for example, diameters of the wire 13 and the initial ball 22, and generally falls within a range from 50 to 100 μm from the upper surface of the pressure-bonded ball 12. When the neck wire 23 is pushed by the capillary 14 in the first arcing motion, the pushing of the hardened portion of the neck wire 23 can damage the hardened portion of the neck wire 23 if a depth by which the neck wire 23 is pushed is too much. In contrast, if the pushing depth is too small, the hardened portion would be fitted along the horizontal direction and causes upward repulsion when pushing the neck wire 23, and the height of the wire loop as a whole often cannot be made low. In this respect, the rising height $H_1$ of the capillary 14 in the first sequential movement is set slightly higher than the thermally hardened portion of the neck wire 23 and the radius $r_1$ in the arcing motion is increased, such that the neck wire 23 is moderately curved so as to prevent the damage, and that a portion that is not hardened above the hardened portion of the neck wire 23 extends in the horizontal direction in the first arcing motion of the capillary 14. With this, it is possible to prevent damage to the neck wire 23, as well as to reduce the height of the wire loop as a whole.

Figure 4:
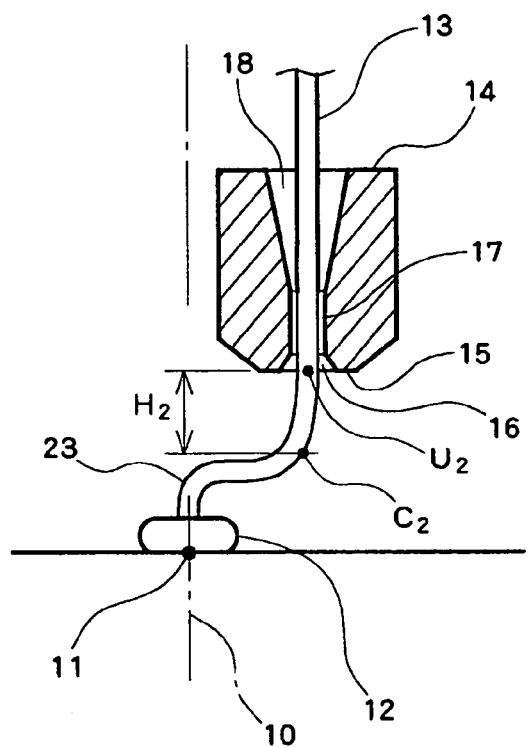
FIG. 4 is an illustrative diagram showing a second sequential movement in the pushing step of the exemplary embodiment of the wire-bonding method according to the present invention.
Figure 5A:
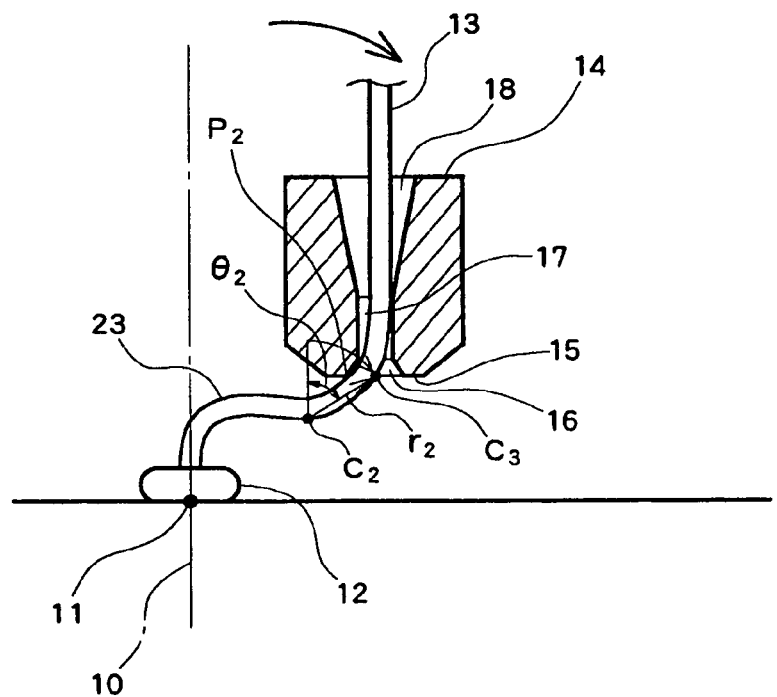
FIG. 5(a) is an illustrative diagram showing the second sequential movement in the pushing step of the exemplary embodiment of the wire-bonding method according to the present invention.

Upon completion of the first sequential movement of the upward motion and the arcing motion of the capillary 14 shown in FIG. 2 and FIG. 3(a), a second sequential movement is started as shown in FIG. 4 and FIGS. 5(a), (b). As shown in FIG. 4, the tip end of the capillary 14 is moved substantially vertically upward by a height $H_2$ from the point $C_2$ at which the first arcing motion of the capillary 14 has ended. Upon completion of the upward movement of the capillary 14, the tip end at the center of the capillary 14 in its axial direction is positioned at a point $U_2$ that is higher than the point $C_2$ by the height $H_2$. In this process, the rising height $H_2$ of the capillary 14 can be smaller than the first rising height $H_1$ of the capillary 14.

As shown in FIGS. 5(a), (b) and FIG. 12, centering the point $C_2$ at which the first arcing motion of the capillary 14 has ended, the capillary 14 is moved toward the second bonding point 19 by an angle $\theta_2$ arc-wisely along an arc having the height $H_2$ as its radius $r_2$ shown in FIG. 4. The angle $\theta_2$ is smaller than 90 degrees and, for example, about 45 degrees. In addition, the angle $\theta_2$ can be smaller than the angle $\theta_1$. Upon completion of the second arcing movement of the capillary 14, the tip end at the center of the capillary 14 in its axial direction is positioned at a point $C_3$, which is closer to the second bonding point 19 than the point $U_2$ is, and at a height between the point $U_2$ and the point $C_2$. In other words, the capillary 14 is moved downward in the arcing movement from the point $U_2$ by a difference in height between the point $U_2$ and the point $C_3$, and moved from the point $U_2$ toward the second bonding point 19. As the difference in height between the point $U_2$ and the point $C_3$ is smaller than the rising height $H_2$ of the capillary 14 shown in FIG. 4, the tip end of the capillary 14 is moved downward by the arcing motion by a distance smaller than the rising distance $H_2$ of the capillary 14, and obliquely downward toward the second bonding point 19. By this movement, the wire 13 is again curved toward the second bonding point 19, and the wire 13 is pushed downward so as to form a second kinked portion to loop in the horizontal direction. When the rising height $H_2$ of the capillary 14 is made smaller than the first rising height $H_1$ of the capillary 14, it is possible to reduce the curving radius $r_2$ as well, thereby increasing the pressing force to the wire 13. In the second arcing motion, the kinked portion extending in the horizontal direction can be effectively formed in the wire 13 by reducing the curving radius $r_2$ and increasing the pressing force, because the portion of the wire 13 that is not hardened is curved toward the second bonding point 19 and the wire 13 is pushed obliquely downward (wire pushing step).

Figure 5B:
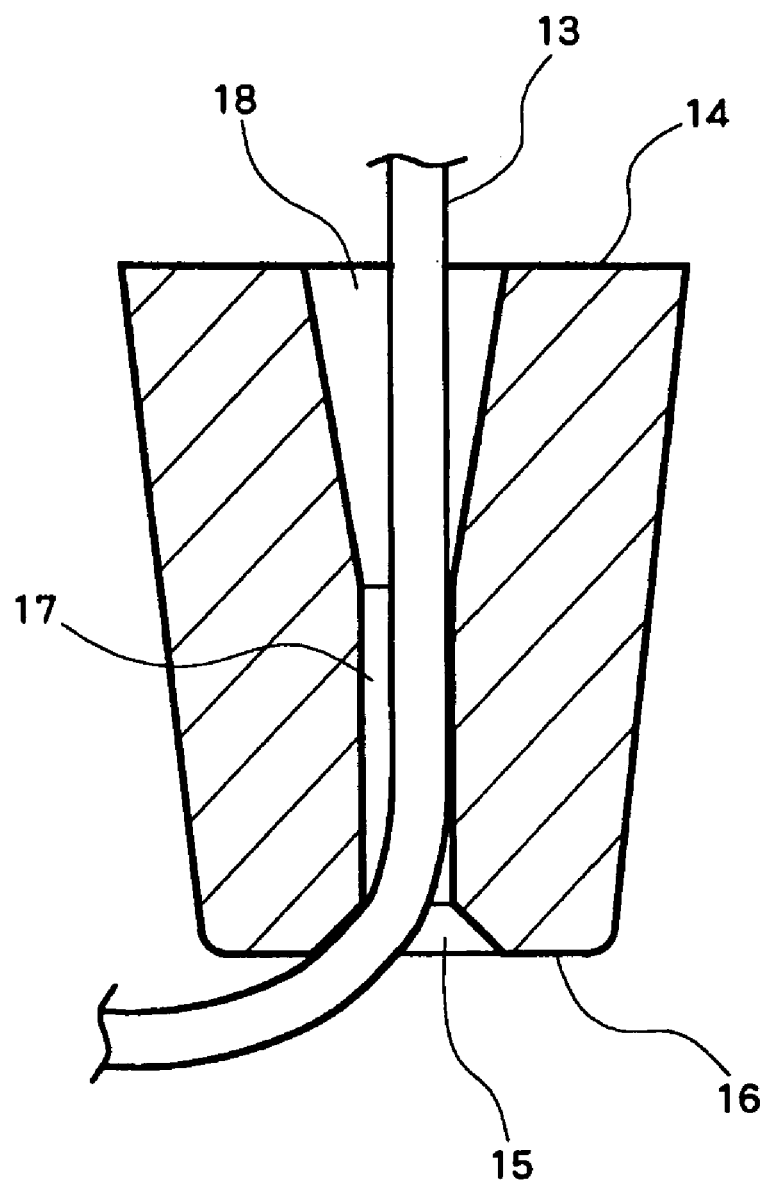
FIG. 5(b) is an enlarged view of the capillary and the wire shown in FIG. 5(a) that are being moved.

When the capillary 14 makes the second arcing motion, as shown in FIG. 5(b), the wire 13 is laterally moved by the tapered portion of the inner chamfer 15 of the capillary 14 and pushed downward. Similarly to the first arcing motion, as the capillary 14 moves arc-wisely in the arc centering the point $C_2$, the distance between the point $C_2$ and the tip end at the center of the capillary 14 in its axial direction and the point $C_2$ remains constant without making any substantial change. As a result, the wire 13 is not pulled by the capillary 14 in the axial direction of the wire 13 when the capillary 14 is moved obliquely downward from the point $U_2$ toward the point $C_3$, and it is possible to prevent the wire 13 from becoming thin due to the tensile load and to prevent the wire strength from being reduced.

Figure 6:
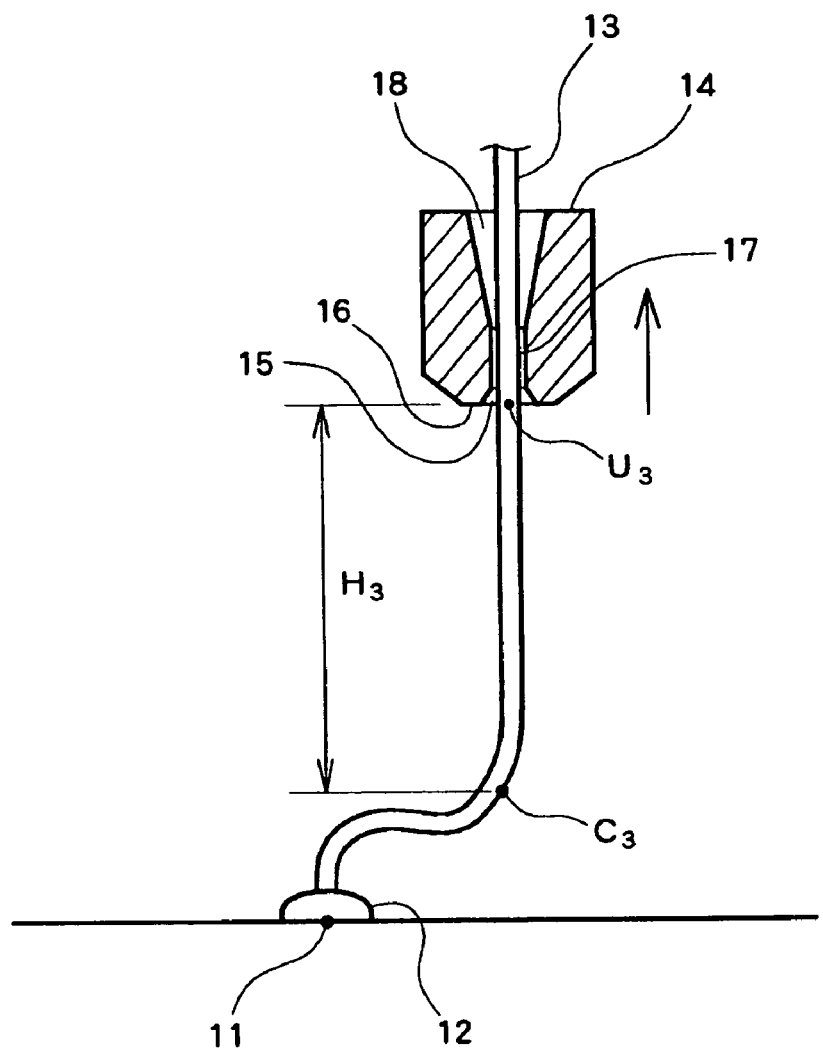
FIG. 6 is an illustrative diagram showing a third sequential movement in the pushing step of the exemplary embodiment of the wire-bonding method according to the present invention.
Figure 7:
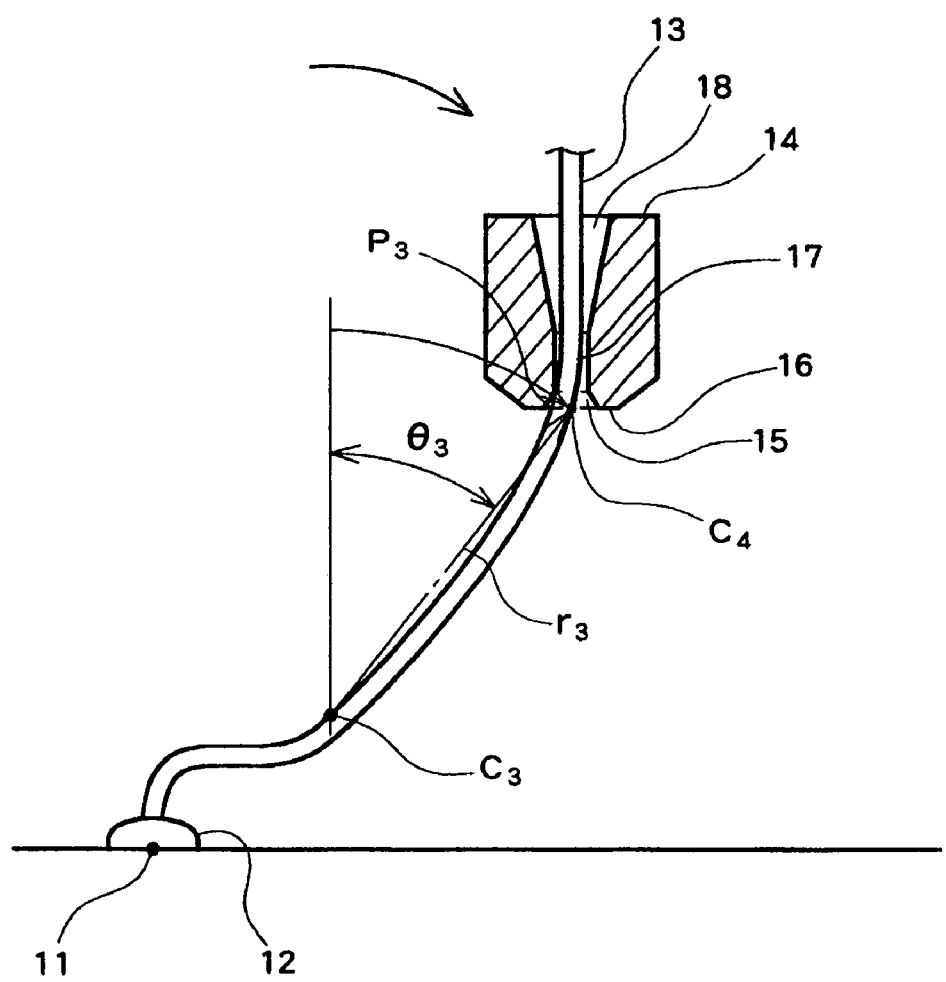
FIG. 7 is an illustrative diagram showing the third sequential movement in the pushing step of the exemplary embodiment of the wire-bonding method according to the present invention.

Upon completion of the second sequential movement of the upward motion and the arcing motion of the capillary 14 shown in FIG. 4 and FIG. 5(a), a third sequential movement is started as shown in FIG. 6 and FIG. 7. As shown in FIG. 6, the tip end of the capillary 14 is moved substantially vertically upward by a height $H_3$ from the point $C_3$ at which the second arcing motion of the capillary 14 has ended. Upon completion of the upward movement of the capillary 14, the tip end at the center of the capillary 14 in its axial direction is positioned at a point $U_3$ that is higher than the point $C_3$ by the height $H_3$. In the third sequential movement, it is only required to push the wire 13 slightly obliquely downward at a position distant from the pressure-bonded ball 12. Therefore, the rising height $H_3$ of the capillary 14, which is determined based on the entire shape of a wire loop 21, can be larger than the first rising height $H_1$ and the second rising height $H_2$ of the capillary 14.

As shown in FIG. 7 and FIG. 12, centering the point $C_3$ at which the second arcing motion of the capillary 14 has ended, the capillary 14 is moved toward the second bonding point 19 by an angle $\theta_3$ arc-wisely along an arc having the height $H_3$ as its radius $r_3$ shown in FIG. 6. The angle $\theta_3$ is smaller than 90 degrees and, for example, about 45 degrees. In addition, the angle $\theta_3$ can be smaller than the angle $\theta_1$ and the angle $\theta_2$. Upon completion of the third arcing movement of the capillary 14, the tip end at the center of the capillary 14 in its axial direction is positioned at a point $C_4$, which is closer to the second bonding point 19 than the point $U_3$ is, and at a height between the point $U_3$ and the point $C_3$. The capillary 14 is moved downward in the arcing movement from the point $U_3$ by a difference in height between the point $U_3$ and the point $C_4$, and moved from the point $U_3$ toward the second bonding point 19. As the difference in height between the point $U_3$ and the point $C_4$ is smaller than the rising height $H_3$ of the capillary 14 shown in FIG. 6, the tip end of the capillary 14 is moved downward by the arcing motion by a distance smaller than the rising distance $H_3$ of the capillary 14, and then obliquely downward toward the second bonding point 19. With this movement, the wire 13 is again moderately curved toward the second bonding point 19, and the wire 13 is pushed obliquely downward so as to form a third kinked portion to loop in the horizontal direction. The third kinked portion can be smaller than the first and second kinked portions (wire pushing step).

When the capillary 14 makes the third arcing motion, similarly to the second arcing motion, the wire 13 is laterally moved by the tapered portion of the inner chamfer 15 of the capillary 14 and pushed downward. Similarly to the first and second arcing motions, as the capillary 14 moves arc-wisely in the arc centering the point $C_3$, the wire 13 is not pulled by the capillary 14 in an axial direction of the wire 13, and it is possible to prevent the wire 13 from becoming thin due to the tensile load and to prevent the wire strength from being reduced.

Figure 8:
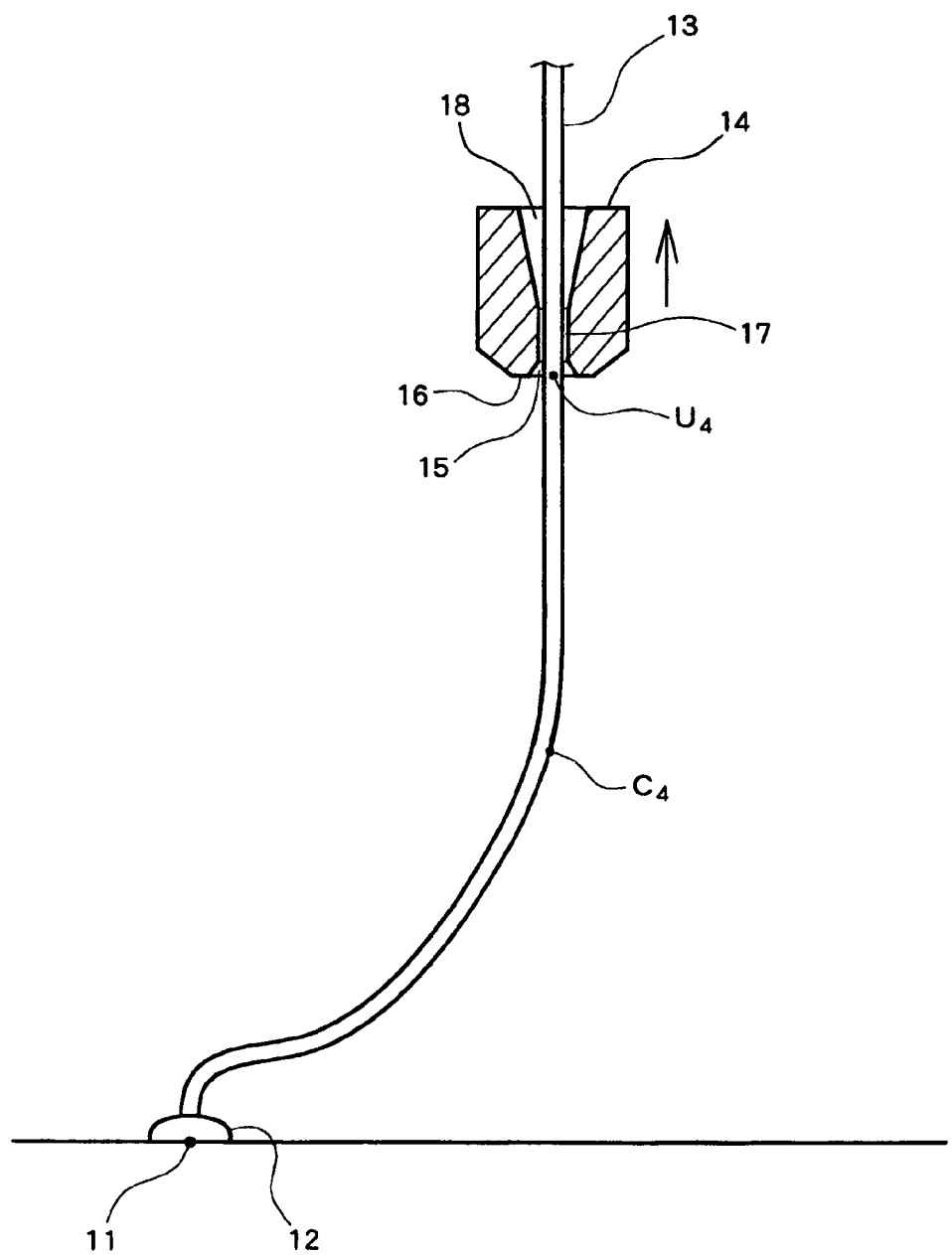
FIG. 8 is an illustrative diagram showing a second bonding step of the exemplary embodiment of the wire-bonding method according to the present invention.
Figure 9:
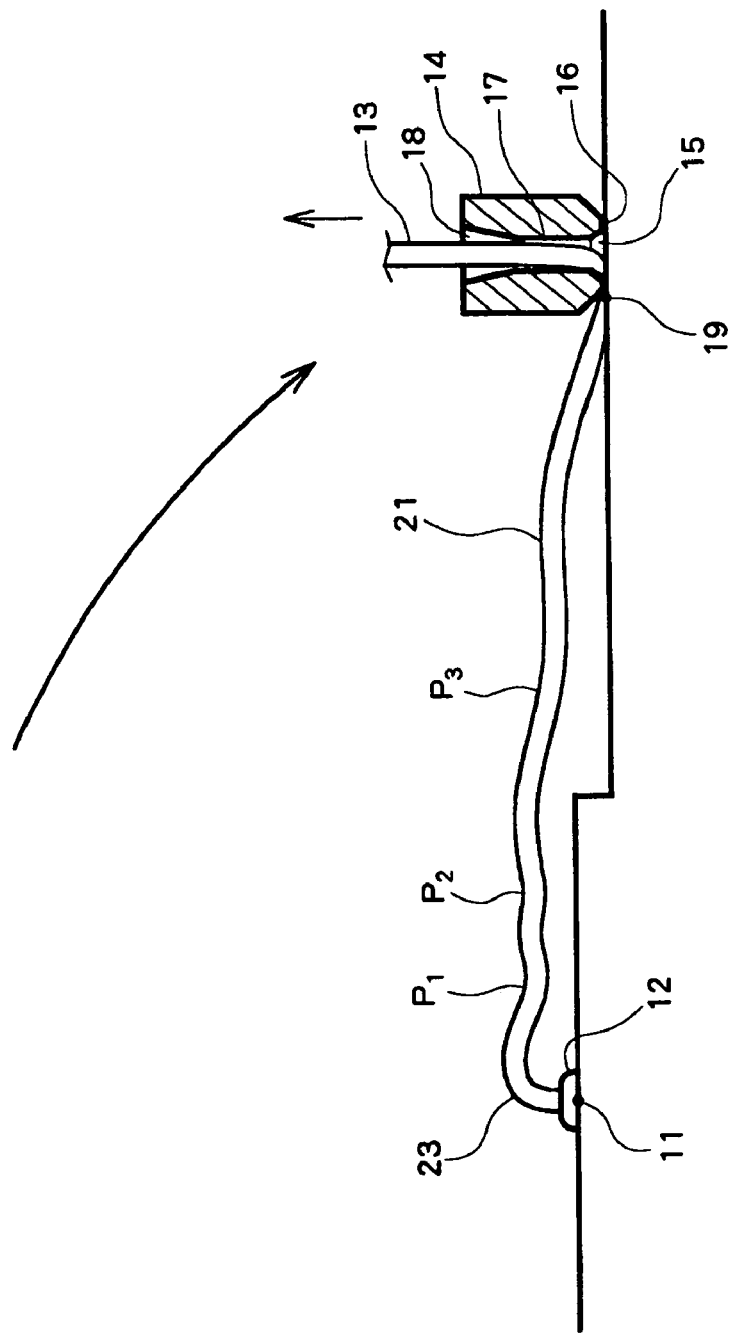
FIG. 9 is an illustrative diagram showing the second bonding step of the exemplary embodiment of the wire-bonding method according to the present invention as well as a wire loop of the exemplary embodiment according to the present invention.

Upon completion of the first sequential movement to the third sequential movement as described above, as shown in FIG. 8, the tip end of the capillary 14 is moved substantially vertically upward from the point $C_4$. Upon completion of the upward movement, the tip end of the capillary 14 is positioned at a point $U_4$. Then, as shown in FIG. 9, the tip end of the capillary 14 is moved from the point $U_4$ toward the second bonding point 19, and the bonding is carried out by pressure-bonding the wire 13 onto the second bonding point 19 with the face portion 16 of the capillary 14. Then, the wire 13 is pulled up along with the capillary 14, and cut at the second bonding point 19, thereby forming the wire loop 21 that connects the first bonding point 11 with the second bonding point 19 (second bonding step). When all the first bonding points 11 are respectively connected with all the second bonding points 19, and the wire loop 21 is formed between each pair of the first bonding point 11 and the second bonding point 19, the assembly of the semiconductor device is completed.

As shown in FIG. 9, the wire loop 21 of the semiconductor device formed by the wire-bonding method according to this exemplary embodiment is continuous to the second bonding point 19 in a manner such that: a portion corresponding to the neck wire 23 curves from the upper surface of the pressure-bonded ball 12 toward the second bonding point 19 slightly downward with respect to the horizontal direction, and the wire then extends slightly upward from a position $P_1$ at which the kinked portion has been formed in the first sequential movement and then slightly downward to a position $P_2$ at which the kinked portion has been formed in the second sequential movement, extends slightly upward from the position $P_2$ at which the kinked portion has been formed in the second sequential movement and then slightly downward to a position $P_3$ at which the kinked portion has been formed in the third sequential movement, and finally reaches the second bonding point 19. As described above, according to the wire-bonding method of this exemplary embodiment, the neck wire 23 or the wire 13 that is continuous from the pressure-bonded ball 12 is curved toward the second bonding point 19, and the wire is pushed obliquely downward, thereby the wire is prevented from curving sharply upward, and thus the height of the wire loop 21 as a whole can be reduced. Also, as described above, the capillary 14 is moved in the arcing movement when the capillary 14 is moved obliquely downward toward the second bonding point 19. As a result, it is possible to prevent the neck wire 23 and the wire 13 from being pulled and becoming thin, and thus the decrease in strength of the wire loop 21 of the semiconductor device can be prevented.

Also, according to this exemplary embodiment, the sequential movement is carried out three times. However, a number of times that the sequential movement is carried out is not limited to three as long as it is more than one, and the sequential movement can be carried out twice, or four times or more.

Figure 13:
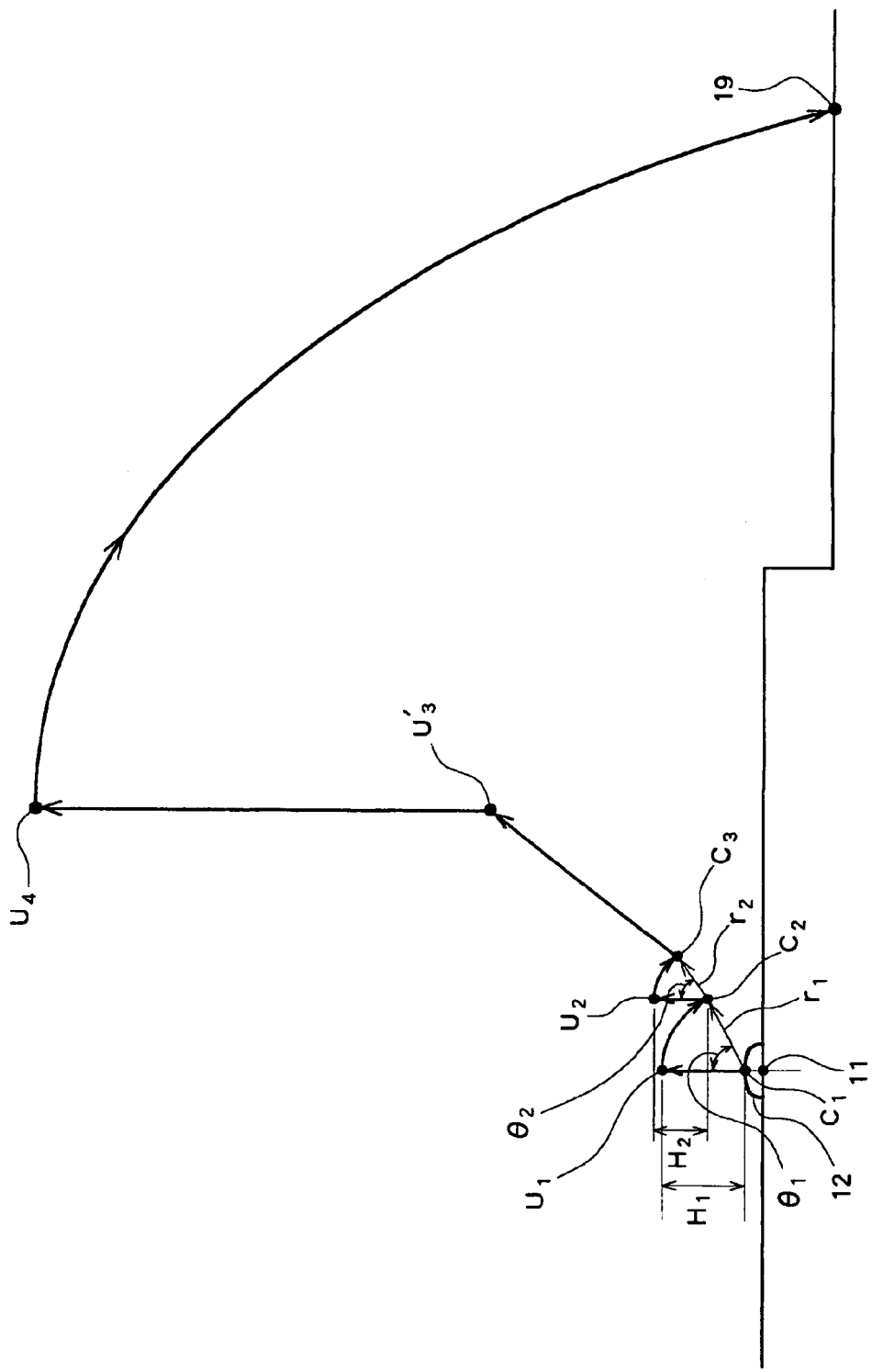
FIG. 13 is an illustrative diagram showing how the tip end of the capillary is moved in a different exemplary embodiment of the wire-bonding method according to the present invention.

Referring to FIG. 13, an exemplary embodiment in which the sequential movement is carried out twice will be explained. Like components are denoted by the same numerals as those used in the exemplary embodiment described with reference to FIGS. 1 to 9 and FIG. 12, and will not be described in detail. As shown in FIG. 13, in this exemplary embodiment, similarly to the exemplary embodiment described previously, after forming the pressure-bonded ball 12 at the first bonding point 11, the tip end of the capillary 14 is moved from the point $C_1$ to the point $U_1$, to the point $C_2$, to the point $U_2$, and to the point $C_3$, and the capillary 14 is then moved obliquely upward toward the second bonding point 19 from the point $C_3$ to a point $U_3'$, moved substantially vertically upward from the point $U_3'$ to the point $U_4$, and then looped toward the second bonding point 19, thereby the bonding onto the second bonding point 19 is carried out.

In this exemplary embodiment, the sequential movement is carried out twice, and, the capillary 14 is moved obliquely upward after the second sequential movement is completed. While the sequential movement is carried out three times and the wire 13 is pressed three times in the previously described exemplary embodiment, it is also possible, as in this exemplary embodiment, to form the third kinked portion in the wire 13 to a certain degree by moving the capillary 14 obliquely upward and then substantially vertically upward after the second sequential movement is completed, and a loop having a similar shape can be formed depending on the length of the wire loop 21 of the semiconductor device. Also, when the length of the wire loop 21 as a whole of the semiconductor device is short, the capillary 14 can be moved substantially vertically upward immediately after the second sequential movement and then looped toward the second bonding point 19, without moving the capillary 14 obliquely upward as in this exemplary embodiment.

Figure 10:
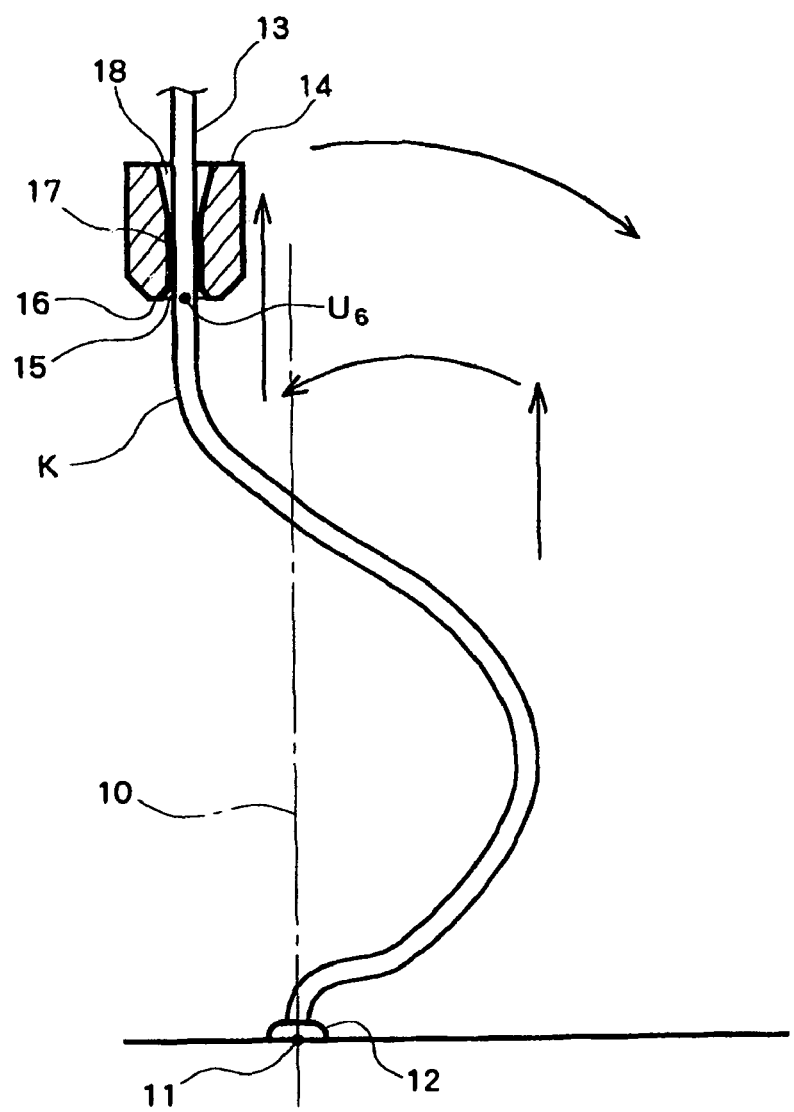
FIG. 10 is an illustrative diagram showing a kink formation step of a different exemplary embodiment of the wire-bonding method according to the present invention.
Figure 11:
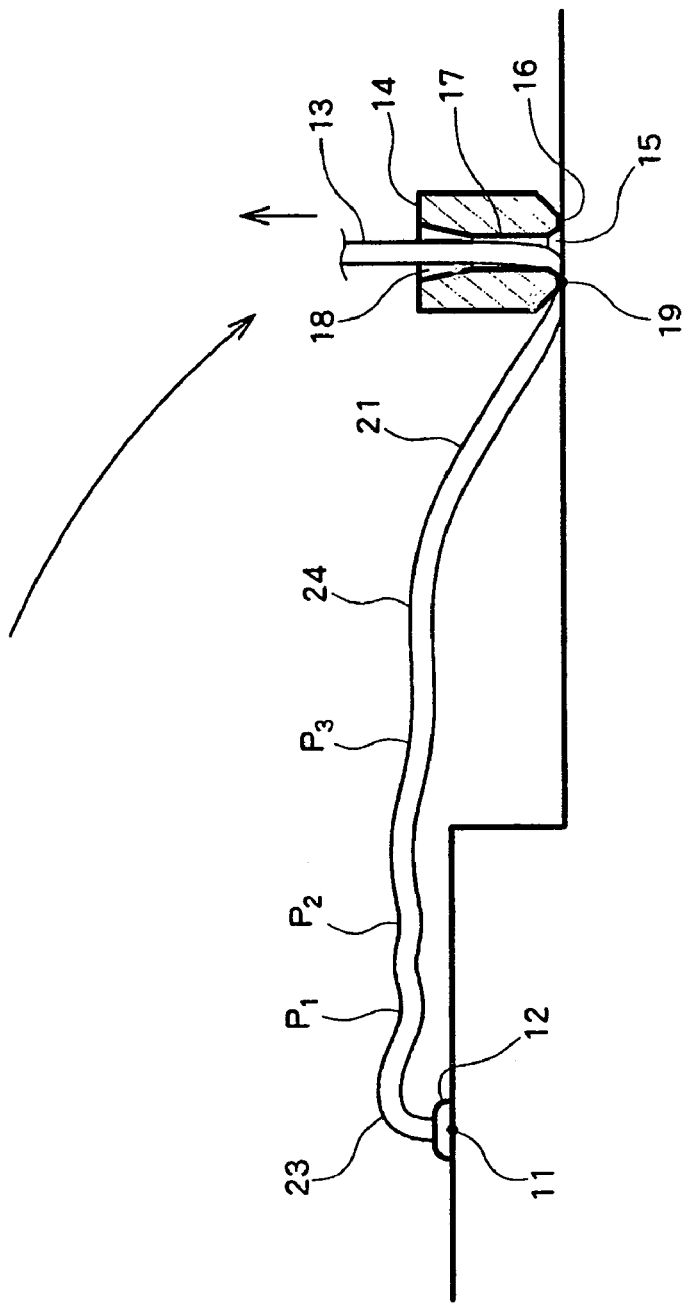
FIG. 11 is an illustrative diagram showing the second bonding step of the different exemplary embodiment of the wire-bonding method according to the present invention as well as the wire loop of the exemplary embodiment according to the present invention.
Figure 14:
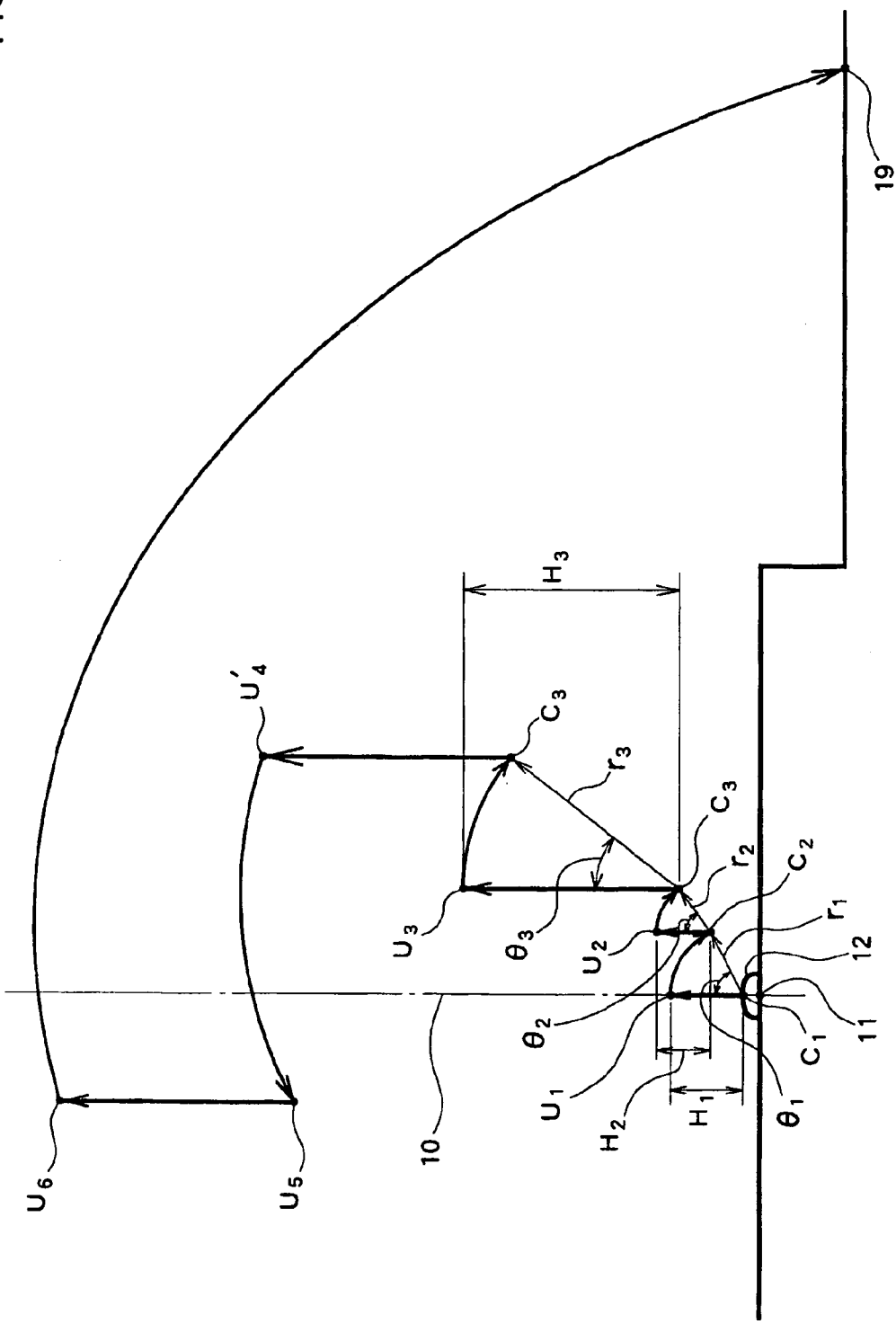
FIG. 14 is an illustrative diagram showing how the tip end of the capillary is moved in the different exemplary embodiment of the wire-bonding method according to the present invention.

Referring to FIG. 10, FIG. 11, and FIG. 14, a different exemplary embodiment will be described. Like components are denoted by the same numerals as those used in the exemplary embodiments described previously, and will not be described in detail. As shown in FIG. 10 and FIG. 14, according to the wire-bonding method of this exemplary embodiment, after carrying out the first sequential movement to the third sequential movement similarly to the exemplary embodiment described previously, as shown in FIG. 10 and FIG. 14, the capillary 14 makes a reverse motion to a point $U_5$ across the center line 10 of the first bonding point 11 from the second bonding point 19 after the tip end of the capillary 14 is moved substantially vertically upward up to a point $U'_4$ (kink forming step). Then, the tip end of the capillary 14 is again moved upward to a point $U_6$. Subsequently, the capillary 14 is moved toward the second bonding point 19, and the bonding is carried out by pressure-bonding the wire 13 onto the second bonding point 19.

According to this exemplary embodiment, similarly to the previously described exemplary embodiments, it is possible to prevent the decrease in strength of the wire loop 21 of the semiconductor device and to make the height of the wire loop as a whole of the semiconductor device low, as well as to form a kink K in the wire 13 by the reverse motion. When the wire loop 21 is formed by bonding the wire 13 onto the second bonding point 19, the kink K is formed into a flexed portion 24 at which the wire 13 that extends substantially horizontally from the position $P_3$ is flexed obliquely downward toward the second bonding point 19 as shown in FIG. 11. With the flexed portion 24, the wire loop 21 is formed into a trapezoidal shape, and, when there is an unevenness between the first bonding point 11 and the second bonding point 19, it is possible to prevent the wire loop 21 from being brought into contact with the uneven portion and to prevent a short circuit from occurring, and it is also possible to increase the strength of the wire loop 21 against deformation. Therefore, it is also possible to prevent, for example, deformation and breakage of the wire loop 21 during resin injection, or deformation and short circuit by cooling air during the wire bonding, thereby improving bonding quality. This exemplary embodiment explains a case in which the single kink K is formed, but a plurality of kinks K can be provided by carrying out the upward movement and the reverse motion more than once such that a plurality of flexed portions 24 are formed in the wire loop 21.

Figure 15:
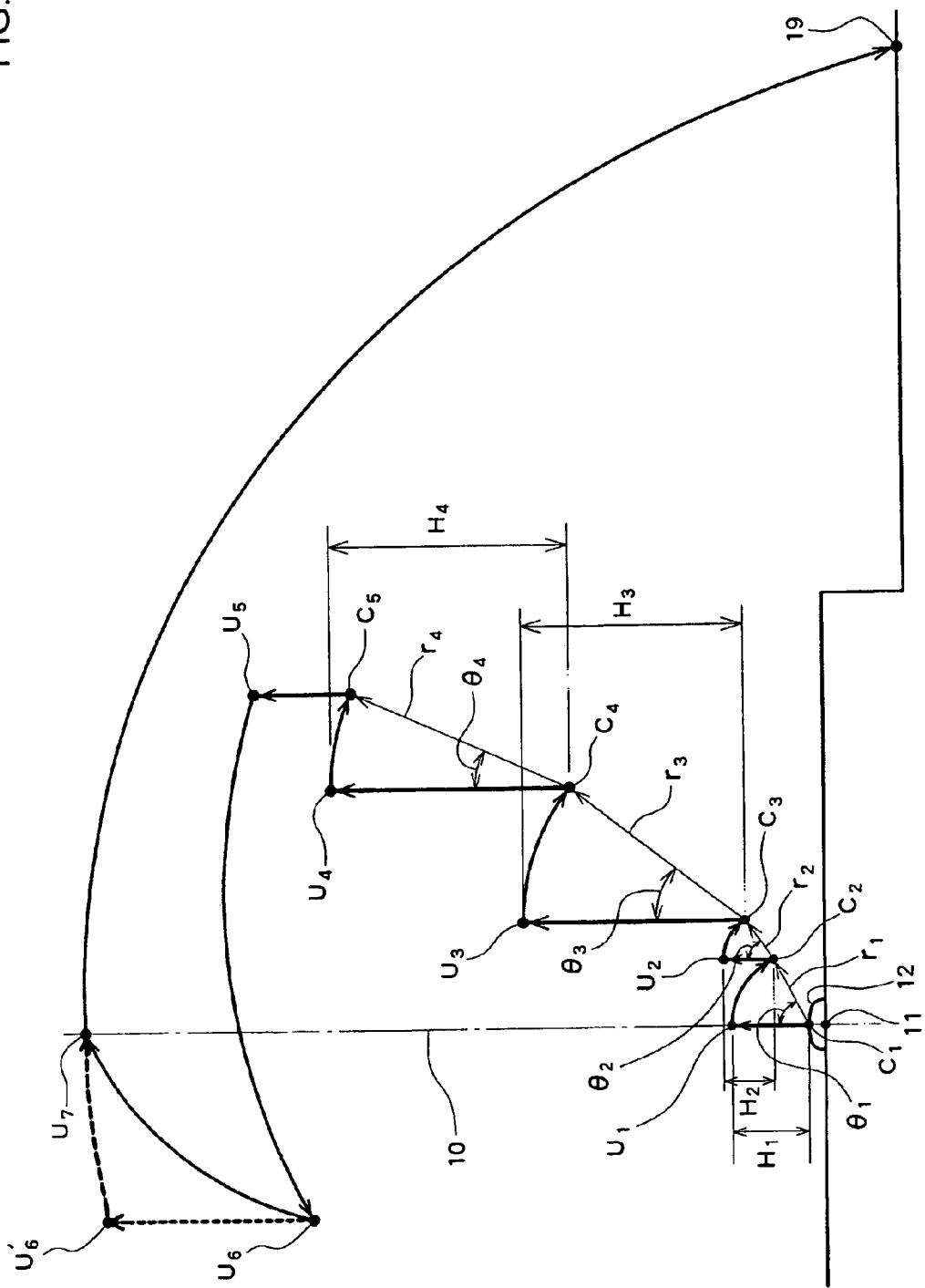
FIG. 15 is an illustrative diagram showing how the tip end of the capillary is moved in a different exemplary embodiment of the wire-bonding method according to the present invention.
Figure 16:
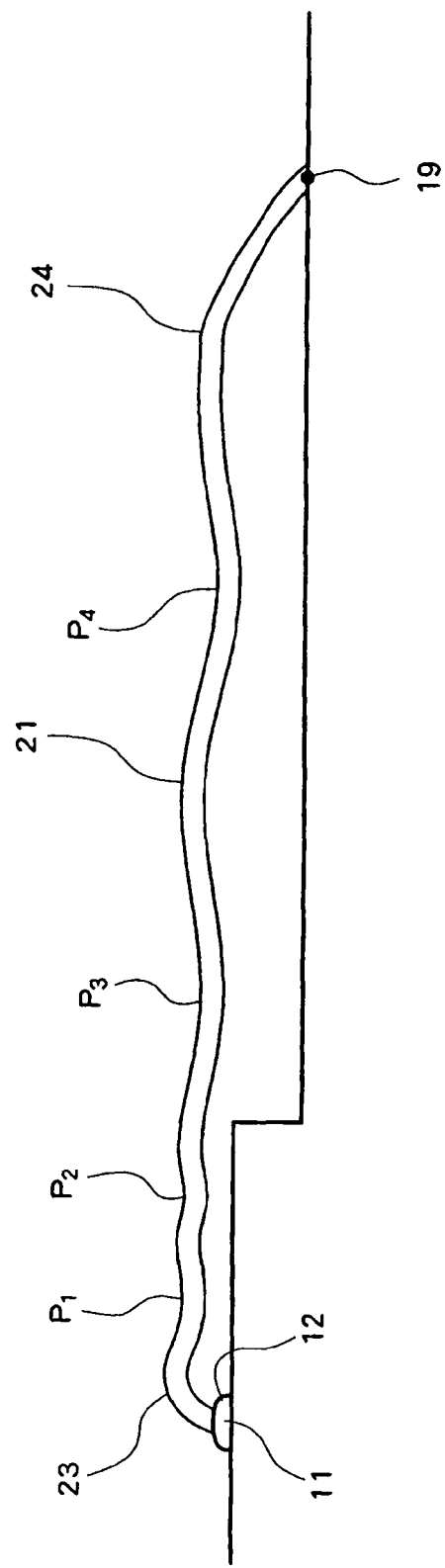
FIG. 16 is an illustrative diagram showing a shape of the wire loop formed by the wire-bonding method of a different exemplary embodiment according to the present invention.

Referring to FIG. 15 and FIG. 16, a different exemplary embodiment will be described. According to this exemplary embodiment, the wire loop 21 longer than that formed in the previously explained exemplary embodiments is formed. Like components are denoted by the same numerals as those used in the exemplary embodiments described previously, and will not be described in detail. As shown in FIG. 15, according to the wire-bonding method of this exemplary embodiment, after carrying out the first sequential movement to the third sequential movement similarly to the exemplary embodiments described previously, a fourth sequential movement is further carried out, in which the tip end of the capillary 14 is moved upward from the point $C_4$ to the point $U_4$ and then arc-wisely in an arc from the point $U_4$ to a point $C_5$ by an angle $\theta_4$, and the wire 13 is pressed four times. Subsequently, as shown in FIG. 15, the tip end of the capillary 14 is moved substantially vertically upward to the point $U_5$, and the capillary 14 makes a reverse motion to a point $U_6$ across the center line 10 of the first bonding point 11 away from the second bonding point 19 (kink forming step). Thereafter, the tip end of the capillary 14 is again moved obliquely upward toward the second bonding point 19 until it reaches a point $U_7$ that is positioned on the center line 10 of the bonding point, and then the capillary 14 is moved from the point $U_7$ toward the second bonding point 19, and the bonding is carried out by pressure-bonding the wire 13 to the second bonding point 19.

According to the exemplary embodiment shown in FIG. 15, the tip end of the capillary 14 is moved obliquely upward from the point $U_6$ to the point $U_7$, and then moved from the point $U_7$ to the second bonding point 19. However, as shown by dotted lines in FIG. 15, it is possible to move the tip end of the capillary 14 substantially vertically upward from the point $U_6$ to a point $U_6'$, then move the capillary 14 toward the second bonding point 19, and carry out the bonding by pressure-bonding the wire 13 onto the second bonding point 19.

As shown in FIG. 16, the wire loop 21 of the semiconductor device formed by this exemplary embodiment is provided with, in addition to the three kinked portions respectively formed at the position $P_1$ to the position $P_3$ and the flexed portion 24 similarly to the previous exemplary embodiment, a kinked portion formed by the fourth sequential movement at a position $P_4$ between the position $P_3$ and the second bonding point 19. When the wire loop 21 is long, the height of the wire loop 21 as a whole often cannot be reduced since the wire sharply curves upward even if the third kinked portion is formed at the position $P_3$. However, as shown in FIG. 16, it is possible to prevent a portion of the wire that is closer to the second bonding point 19 than the third kinked portion formed at the position $P_3$ from curving sharply upward by forming the fourth kinked portion at the position $P_4$ at which the loop height is expected to be high due to the sharp upward curving. As a result, even when the wire loop 21 is long, it is possible to make the height of the wire loop 21 as a whole evenly low.

Figure 17:
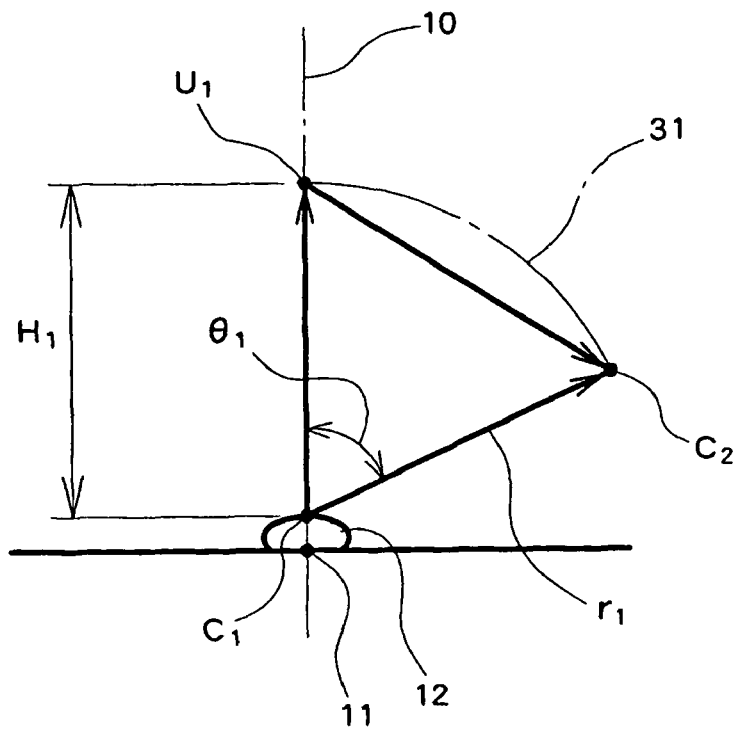
FIG. 17 is an illustrative diagram showing how the tip end of the capillary is moved in a different exemplary embodiment of the wire-bonding method according to the present invention.

Referring to FIG. 17, a different exemplary embodiment according to the present invention will be described. According to the previous exemplary embodiments that have been described with reference to FIGS. 1 to 9 and FIG. 12, the tip end of the capillary 14 is moved arc-wisely in an arc when the capillary 14 is moved obliquely downward toward the second bonding point 19. However, when the rising heights $H_1$ to $H_3$ of the capillary 14 are not very large, or the rotation angles $\theta_1$ to $\theta_3$ in the arcing movement are not very large, the tip end of the capillary 14 can be moved in a linear motion from the point $U_1$ to the point $C_2$, as shown in FIG. 17, instead of making the arcing motion. This is because, when the rising heights $H_1$ to $H_3$ of the capillary 14 are small and the rotation angles $\theta_1$ to $\theta_3$ in the arcing movement are small, the distance between the point $C_1$ and the tip end of the capillary 14 in the oblique movement is small, and thus the force in the axial direction applied to the neck wire 23 or to the wire 13 by the capillary 14 is prevented from increasing, and the decrease in strength due to the deformation of the neck wire 23 or to the wire 13 is made small as well. As it is not necessarily required to move the tip end of the capillary 14 arc-wisely in an arc in this exemplary embodiment unlike the previously explained exemplary embodiments, the control of the bonding apparatus can be simplified.

Figure 18:
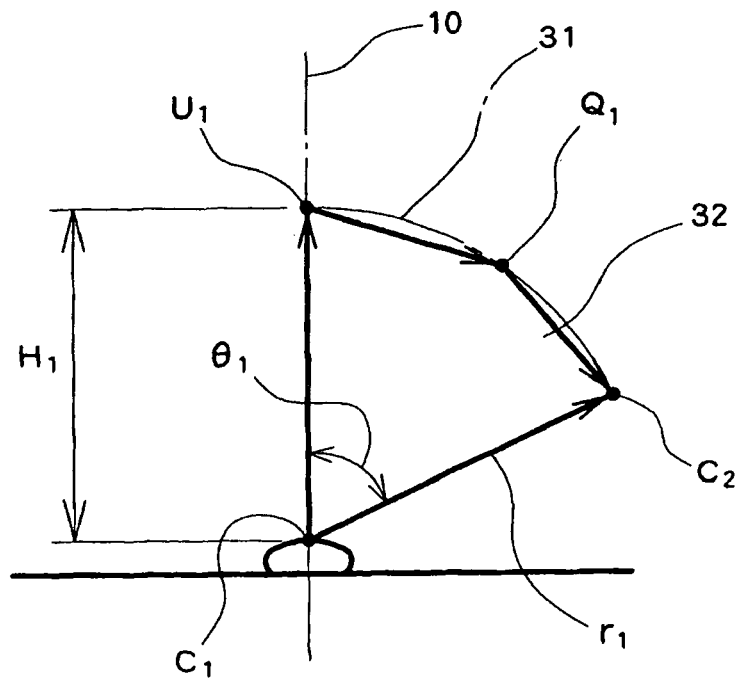
FIG. 18 is an illustrative diagram showing how the tip end of the capillary is moved in a different exemplary embodiment of the wire-bonding method according to the present invention.

Also, as shown in FIG. 18, when the tip end of the capillary 14 is moved from the point $U_1$ to the point $C_2$, the tip end of the capillary 14 can be moved along an approximating polygonal line 32 connecting the chords of an arc 31 having the radius $r_1$ which is equal to the rising height $H_1$ of the capillary 14. In this process, the tip end of the capillary 14 moves sequentially and linearly from the point $U_1$, to a point $Q_1$, and to the point $C_2$. According to this exemplary embodiment, too, similarly to the previously described exemplary embodiment, the bonding apparatus can be simplified.

The invention claimed is:

1. A wire-bonding method of connecting between a first bonding point and a second bonding point by a wire, the method comprising:

a first bonding step of bonding an initial ball formed at a tip end of the wire to the first bonding point using a capillary, thereby forming a pressure-bonded ball;

a wire pushing step, after the first bonding step, of pushing the wire obliquely downward at a plurality of positions by repeating an upward arc-wise movement sequentially for a plurality of times, the upward arc-wise movement including moving of the capillary substantially vertically upward and then obliquely downward toward the second bonding point by a distance shorter than a rising distance that the capillary has moved upward by moving the capillary toward the second bonding point arc-wisely in an arc having a radius equal to the rising distance of the capillary; and a second bonding step, after the wire pushing step, of moving the capillary upward and then toward the second bonding point, and bonding the wire to the second bonding point by pressure-bonding, wherein the rising distance of the capillary in a first one of the upward arc-wise movements is greater than the rising distance of the capillary in a second one of the upward arc-wise movements, the arc-wise movement of the capillary in one of the upward arc-wise movements is an arcing motion centering an ending point of the arc-wise movement of the capillary in a previous one of the upward arc-wise movements, and a moving angle of the arc-wise movement of the capillary in the first upward arc-wise movement is greater than a moving angle of the arc-wise movement of the capillary in the second upward arc-wise movement.

2. The wire-bonding method according to claim 1, wherein in the arc-wise movement in the upward arc-wise movement, the capillary moves along an approximating tangent line that approximates the circular arc by a plurality of lines.

3. The wire-bonding method according to claim 1, wherein the rising distance of the capillary in third and subsequent ones of the upward arc-wise movements is greater than the rising distance of the capillary in the first and second arc-wise movements.

4. The wire-bonding method according to claim 1, further comprising:
a kink forming step, between the wire pushing step and the second bonding step, of forming a kink in the wire by carrying out a reverse motion at least once, the reverse motion including moving of the capillary upward and then across a center line of the first bonding point away from the second bonding point.

5. The wire-bonding method according to claim 1, wherein the upward arc-wise movement is repeated twice.

6. The wire-bonding method according to claim 2, wherein the upward arc-wise movement is repeated twice.

7. The wire-bonding method according to claim 2, wherein the rising distance of the capillary in third and subsequent ones of the upward arc-wise movements is greater than the rising distance of the capillary in the first and second upward arc-wise movements.

8. The wire-bonding method according to claim 3, further comprising:
a kink forming step, between the wire pushing step and the second bonding step, of forming a kink in the wire by carrying out a reverse motion at least once, the reverse motion including moving of the capillary upward and then across a center line of the first bonding point away from the second bonding point.

* * * * *